(12) United States Patent
Moore et al.

(10) Patent No.: US 7,619,247 B2
(45) Date of Patent: Nov. 17, 2009

(54) STRUCTURE FOR AMORPHOUS CARBON BASED NON-VOLATILE MEMORY

(75) Inventors: John Moore, Boise, ID (US); Kristy A. Campbell, Boise, ID (US); Joseph F. Brooks, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 534 days.

(21) Appl. No.: 11/447,921

(22) Filed: Jun. 7, 2006

(65) Prior Publication Data

US 2006/0219994 A1 Oct. 5, 2006

Related U.S. Application Data

(62) Division of application No. 10/921,098, filed on Aug. 19, 2004.

(51) Int. Cl.
*H01L 29/08* (2006.01)
(52) U.S. Cl. ................... 257/50; 257/2; 257/42; 257/295; 257/530
(58) Field of Classification Search .......... 257/530, 257/50, 2, 42, 295
See application file for complete search history.

(56) References Cited

U.S. PATENT DOCUMENTS

| | | | |
|---|---|---|---|
| 6,482,741 B1 | 11/2002 | Ueno | |
| 6,486,065 B2 | 11/2002 | Vyvoda et al. | |
| 6,511,645 B1 | 1/2003 | Nesbitt et al. | |
| 6,642,107 B2 | 11/2003 | Seo et al. | |
| 6,649,969 B2 | 11/2003 | Tsuji et al. | |
| 6,683,322 B2 * | 1/2004 | Jackson et al. | 257/40 |
| 6,689,644 B2 | 2/2004 | Johnson | |
| 6,777,773 B2 * | 8/2004 | Knall | 257/530 |

OTHER PUBLICATIONS

E. G. Gerstner et al. —"Nonvolatile memory effects in nitrogen doped tetrahedral amorphous carbon thin films," Journal of Applied Physics, vol. 84, No. 10, Nov. 15, 1998, pp. 5647-5651.

* cited by examiner

*Primary Examiner*—Howard Weiss
*Assistant Examiner*—Steven H Rao
(74) *Attorney, Agent, or Firm*—Dickstein Shapiro, LLP (57) ABSTRACT

A memory device including at least one first memory element comprising a first layer of amorphous carbon over at least one second memory element comprising a second layer of amorphous carbon. The device also includes at least one first conductive layer common to the at least one first and the at least one second memory elements.

31 Claims, 9 Drawing Sheets

STRUCTURE FOR AMORPHOUS CARBON BASED NON-VOLATILE MEMORY

CROSS REFERENCE TO RELATED APPLICATIONS

The present application is a divisional application of U.S. patent application Ser. No. 10/921,098, filed on Aug. 19, 2004, the disclosure of which is herewith incorporated by reference in its entirety.

FIELD OF THE INVENTION

The invention relates to the field of random access memory (RAM) devices formed using a resistance variable material.

BACKGROUND

Resistance variable memory elements, which include Programmable Conductive Random Access Memory (PCRAM) elements, have been investigated for suitability as semi-volatile and non-volatile random access memory elements. A typical PCRAM device is disclosed in U.S. Pat. No. 6,348,365, which is assigned to Micron Technology, Inc.

A PCRAM device typically includes chalcogenide glass, for example, a $Ge_xSe_{100-x}$ glass, as the active switching material. A conductive material, such as silver, is incorporated into the chalcogenide glass creating a conducting channel. During operation of the device, the conducting channel can receive and expel metal ions (e.g., silver ions) to program a particular resistance state (e.g., a higher or a lower resistance state) for the memory element through subsequent programming voltages, such as write and erase voltages. After a programming voltage is removed, the programmed resistance states can remain intact for an indefinite period, generally ranging from hours to weeks. In this way, the typical chalcogenide glass-based PCRAM device functions as a variable resistance memory having at least two resistance states, which define two respective logic states.

A chalcogenide glass-based device, however, can become unstable at higher temperatures. Accordingly, it is desired to have a memory device based on materials other than chalcogenide glass, particularly a material that would provide improved thermal stability. It is also desired to have a memory device with an architecture that permits efficient surface area usage.

SUMMARY

Exemplary embodiments of the invention provide a memory device including at least one first memory element comprising a first layer of amorphous carbon over at least one second memory element comprising a second layer of amorphous carbon. The device also includes at least one first conductive layer common to the at least one first and the at least one second memory elements.

BRIEF DESCRIPTION OF THE DRAWINGS

The foregoing and other features and advantages of the invention will become more apparent from the detailed description of exemplary embodiments provided below with reference to the accompanying drawings in which.

DETAILED DESCRIPTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but can be any support structure suitable for supporting an integrated circuit. For example, the substrate can be ceramic or polymer-based.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "silver-selenide" is intended to include various species of silver-selenide, including some species which have a slight excess or deficit of silver, for instance, $Ag_{2+/-x}Se$, where x is within the range of approximately 0 to approximately 1. Likewise, the term "tin-selenide" is intended to include various species of tin-selenide, including some species which have a slight excess or deficit of tin, for instance, $Sn_{1+/-x}Se$, where x is within the range of approximately 0 to approximately 1. Also, the term "antimony-selenide" is intended to include various species of antimony-selenide, including some species which have a slight excess or deficit of antimony, for instance, $Sb_{2+/-x}Se_3$ or $Sb_{2+/-x}Se_5$, where x is within the range of approximately 0 to approximately 1.

The term "resistance variable memory element" is intended to include any memory element that exhibits a programmable resistance change in response to an applied voltage.

Exemplary embodiments of the invention include a one time programmable memory device having one or more resistance variable memory elements, each including amorphous carbon as the active switching material (i.e., the material that switches states corresponding to logical ones and zeros). It is known that amorphous carbon has a non-crystalline structure including sp2 and sp3 hybridized carbon. The ratio of sp2 to sp3 hybridized carbon can vary. According to exemplary embodiment of the invention, the amount of sp3 hybridized carbon is greater than the amount of sp2 hybridized carbon. Unlike a typical chalcogenide-based device, it has been experimentally shown that a memory element according to the invention is able to withstand very high temperatures (e.g., greater than 260° C.) for periods of at least 30 minutes. Amorphous carbon-based memory elements are described in more detail in U.S. patent application Ser. No. 10/899,010, which is incorporated herein by reference and assigned to Micron Technology. Inc.

The memory devices according to the exemplary embodiments of the invention have cross point-type architecture. Also, memory elements of the memory devices according to exemplary embodiments of the invention can be stacked to allow the device to have a greater number of memory elements within the same surface area.

Figure 1A:
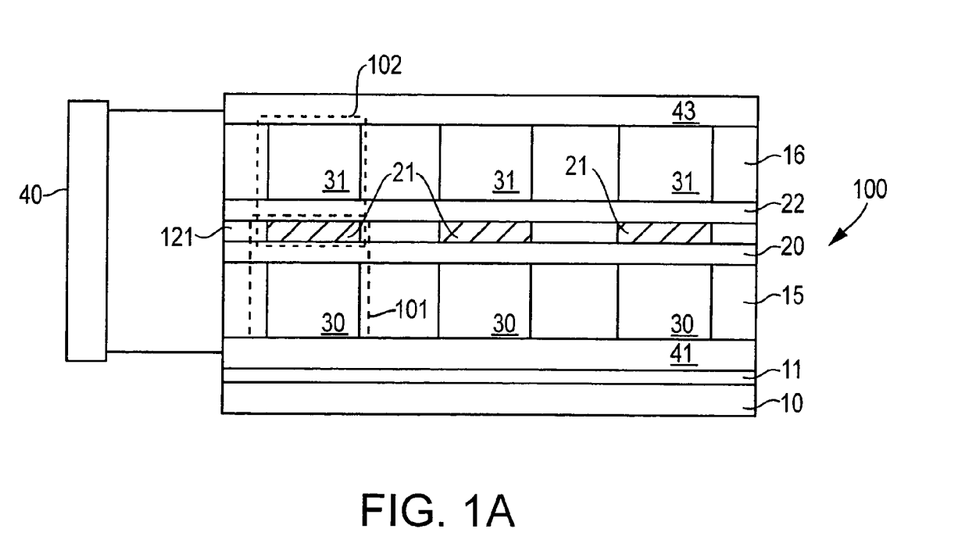
FIG. 1A illustrates a cross sectional view of a memory device according to an exemplary embodiment of the invention.
Figure 1B:
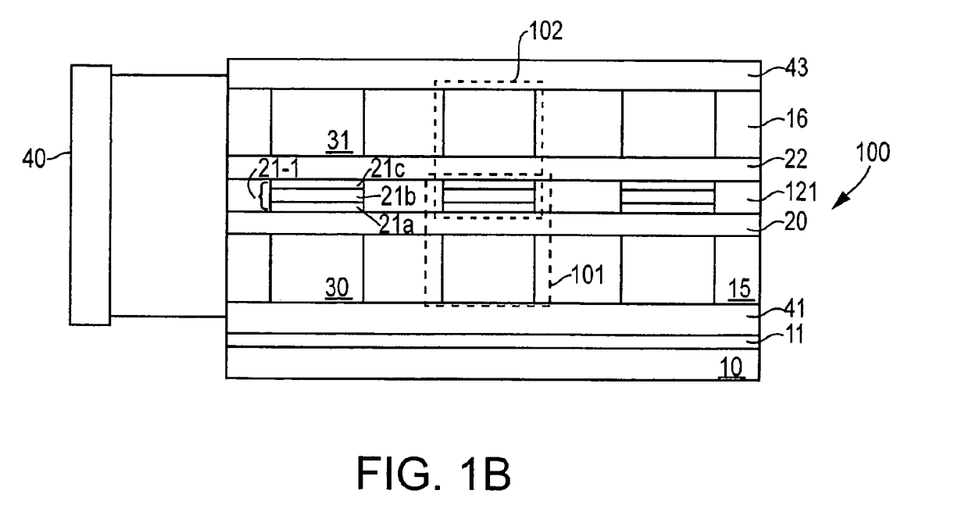
FIG. 1B illustrates an alternative exemplary embodiment of the memory device of FIG. 1A.

FIG. 1A depicts a first exemplary embodiment of a memory device 100 constructed in accordance with the invention; and FIG. 1B depicts an alternative exemplary embodiment of the memory device 100. The memory device 100 includes an array of stacked memory elements 101, 102. The memory device 100 includes a first address line 41, which is coupled to first memory elements 101 through first plugs 30; and a second address line 43, which is coupled to second memory elements 102 through second plugs 31. The device 100 also includes first and second amorphous carbon layers 20, 22. In the embodiment of FIG. 1A, silver lines 21 are located between the amorphous carbon layers 20, 22. Alternatively, as shown in FIG. 1B, a stack of layers 21-1, including conductive lines 21b, can be located between the amorphous carbon layers 20, 22.

The device 100 is supported by a substrate 10. Over the substrate 10, though not necessarily directly so, is the first conductive address line 41. An insulating layer 11 can be provided between the substrate 10 and the first address line 41. The first address line 41 serves as an interconnect for a plurality of first memory elements 101. The first address line 41 can be any material suitable for providing an interconnect line, such as doped polysilicon, silver (Ag), gold (Au), copper (Cu), tungsten (W), nickel (Ni), aluminum (Al), platinum (Pt), titanium (Ti), among other materials.

The first address line 41 is connected to a plurality of first conductive plugs 30. Each first conductive plug 30 serves as an electrode for a respective memory element 101 and can be any suitable conductive material. For example, the first conductive plugs 30 can be doped polysilicon, tungsten (W), nickel (Ni), aluminum (Al), platinum (Pt), titanium (Ti), among other materials. The conductive plugs 30 are formed within an insulating layer 15.

Over the first conductive plugs 30 is the first layer 20 of amorphous carbon and the second layer 22 of amorphous carbon. The layers 20, 22 are formed as blanket layers. In the exemplary embodiment of FIGS. 1A and 1B, the first and second amorphous carbon layers 20, 22 have a thickness within the range of approximately 50 Angstroms (Å) to approximately 500 Å, and preferably between approximately 100 Å to approximately 300 Å. The first and second amorphous carbon layers 20, 22 have a greater amount of $sp^3$ hybridized carbon than $sp^2$ hybridized carbon.

As shown in FIG. 1A, silver lines 21 are provided between the first and second amorphous carbon layer 20, 22. The silver lines 21 are formed perpendicular to the first and second address lines 41, 43. The silver lines 21 are formed within an insulating layer 121 and preferably have a thickness within the range of approximately 300 Å to approximately 1000 Å, and more preferably between approximately 300 Å to approximately 500 Å. The silver lines 21 serve as an electrode for the memory elements 101, 102.

Alternatively, as shown in FIG. 1B, each of the silver lines 21 can instead be a stack of layers 21-1 including a conductive line 21b between first and second metal containing layers 21a, 21c. The conductive line 21b serves as an electrode for its respective memory element 101, 102 and can be formed of any suitable conductive material. According to one exemplary embodiment, the conductive line 21b is tungsten. The metal containing layers 21a, 21c can be formed of, for example, silver, tin-selenide (SnSe), antimony-selenide (SbSe), or silver-selenide (AgSe). Also, in alternative embodiments, the first and second metal containing layers 21a, 21c can be blanket layers (not shown). In such a case, the first metal containing layer 21a would be a blanket layer over the first amorphous carbon layer 20 and the second metal containing layer 21c would be a blanket layer over the conductive lines 21b and the insulating layer 121.

Second conductive plugs 31, which can be formed within an insulating layer 16, are provided over the second amorphous carbon layer 22. Similar to the first conductive plugs 30, the second conductive plugs 31 can be any suitable conductive material, such as doped polysilicon, tungsten (W), nickel (Ni), aluminum (Al), platinum (Pt), titanium (Ti), among other materials. Each second conductive plug 31 serves as an electrode to a respective memory element 102.

Each second conductive plug 31 is connected to the second address line 43. Similar to the first address line 41, the second address line 43 can be any material suitable for providing an interconnect line, such as doped polysilicon, silver (Ag), gold (Au), copper (Cu), tungsten (W), nickel (Ni), aluminum (Al), platinum (Pt), titanium (Ti), among other materials. The address line 43 serves as an interconnect for a plurality of memory elements 102.

The first conductive plugs 30 are located at points where the first conductive line crosses below a silver line 21 (FIG. 1A) and the second conductive plugs 31 are located at points where the second conductive line crosses over a silver line 21. Alternatively, the first conductive plugs 30 are located at points where the first conductive line crosses below a stack 21-1 (FIG. 1B) and the second conductive plugs 31 are located at points where the second conductive line crosses over a stack 21-1. Accordingly, the locations at which the first conductive address line 41 is coupled to the first amorphous carbon layer 20 through the first conductive plugs 30 define the memory elements 101. Correspondingly, the locations at which a second conductive address line 43 is coupled to the second amorphous carbon layer 22 through the second conductive plugs 31 define the memory elements 102. Therefore, each silver line 21 (or conductive line 21b (FIG. 1B), serves as an electrode to both memory elements 101 and memory elements 102. In this manner, the memory elements 101, 102 are stacked allowing a greater number of memory elements 101, 102 to occupy a given amount of surface area than in a device having memory elements that are not stacked.

The first and second address lines 41, 43 and the silver lines 21 (or conductive lines 21b) are each connected to operational circuitry 40, which is illustrated schematically in FIGS. 1A and 1B but which may be integrated on a semiconductor substrate 10, and includes a voltage source. Although only one first address line 41 and one second address line 43 are shown, it should be appreciated that the device 100 can include a plurality of first and second address lines 41, 43. During operation of the device 100, potentials are applied across one or more of the memory elements 101, 102 to perform conditioning, write and/or read operations. The operation of the device 100 is described in more detail below in connection with FIGS. 3A-3C.

FIGS. 2A-2F depict the formation of the memory element 100 according to an exemplary embodiment of the invention. No particular order is required for any of the actions described herein, except for those logically requiring the results of prior actions. Accordingly, while the actions below are described as being performed in a general order, the order is exemplary only and can be altered if desired.

Figure 2A:
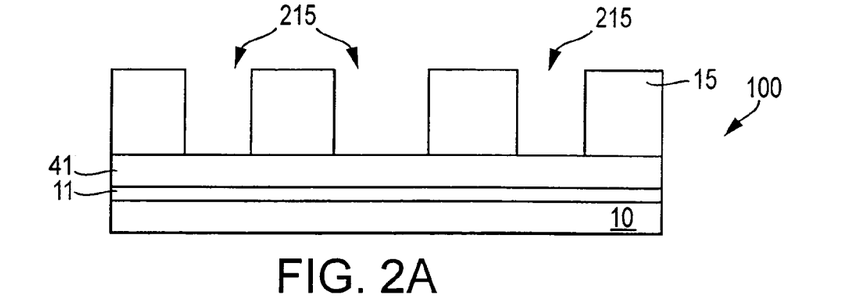
FIGS. 2A-2F illustrate cross-sectional views of the memory device of FIGS. 1A and 1B at different stages of processing.

As shown in FIG. 2A, a substrate 10 is initially provided. As indicated above, the substrate 10 can be semiconductor-based or another material useful as a supporting structure. The insulating layer 11 is formed over the substrate 10 and the first conductive address line 41 is formed over the insulating layer 11. The insulating layer 11 can be formed of any suitable material (e.g., silicon nitride, phosphosilicate glass, borosilicate glass, borophosphosilicate glass, among others) by known techniques. The first address line 41 is formed by depositing a conductive material, such as doped polysilicon, silver, gold, copper, tungsten, nickel, aluminum, platinum, titanium, among other materials. The conductive material is patterned to define the first address line 41. The conductive material may be deposited by any technique known in the art, such as sputtering, chemical vapor deposition, plasma enhanced chemical vapor deposition, evaporation, or plating, and subsequently etched, or a damascene and CMP process can be used.

An insulating layer 15 is formed over the first address line 41. The insulating layer 15 can be silicon nitride, a low dielectric constant material, or other suitable insulators known in the art, and may be formed by any method. Preferably, the insulating layer 15 (e.g., silicon nitride) does not allow silver ion migration. Openings 215 are made in the insulating layer 15 by, for instance, photolithographic and etching techniques.

Figure 2B:
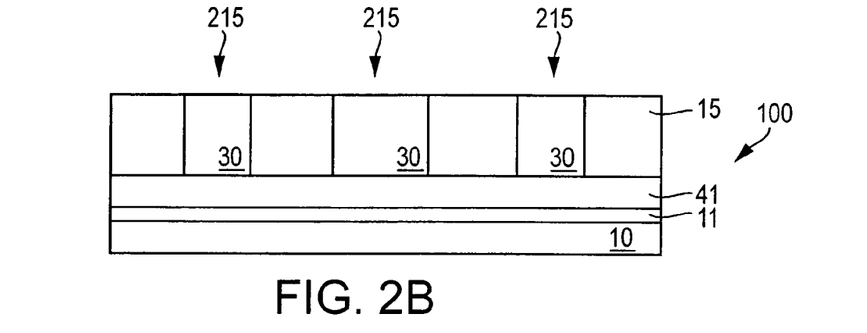

As depicted in FIG. 2B, a layer of conductive material is deposited over the insulating layer 15 and in the openings 215. The conductive material is planarized, for example, by a chemical mechanical polish (CMP) step, to form first conductive plugs 30 within the openings 215. Any suitable conductive material, such as doped polysilicon, tungsten, nickel, aluminum, platinum, titanium, among other materials, can be used to form the first conductive plugs 30.

Figure 2C:
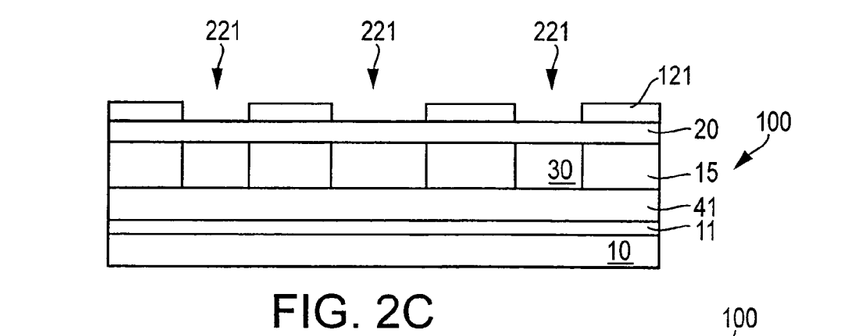

The first amorphous carbon layer 20 is formed over the conductive plugs 30 and insulating layer 15 by any suitable technique, as illustrated in FIG. 2C. According to exemplary embodiments of the invention, the first amorphous carbon layer 20 is formed having a greater amount of sp3 hybridized carbon than sp2 hybridized carbon. The first amorphous carbon layer 20 is formed to a thickness within the range of approximately 50 Å to approximately 500 Å, and preferably between approximately 100 Å to approximtately 300 Å.

Figure 2D:
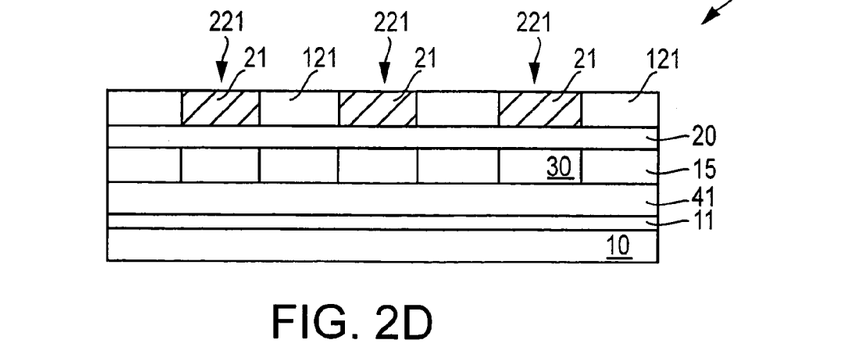

The insulating layer 121 is formed over the first amorphous carbon layer 20. The insulating layer 121 can be formed of any suitable material by known techniques, and is preferably formed of a material that does not permit silver migration (e.g., silicon nitride). Preferably the insulating layer 121 is formed having a thickness within the range of approximately 300 Å to approximately 1000 Å, and more preferably between approximately 300 Å to approximately 500 Å. Openings 221 are then formed in the insulating layer 121, for example, by photolithographic and etching techniques. The openings 221 define the location of the subsequently formed silver lines 21 (FIG. 2D). Therefore, the openings 221 are formed as lines perpendicular to the first conductive address line 41.

As depicted in FIG. 2D, a layer of silver is deposited over the insulating layer 121 and in the openings 221. The silver layer is planarized, for example, by a CMP step, to form silver lines 21 within the openings 221.

Alternatively, when a stack 21-1 (FIG. 1B) is to be formed instead of silver lines 21, a first metal containing layer 21a, a conductive layer 21b, and a second metal containing layer 21c are deposited over the insulating layer 121 and within the openings 221. The layers 21a, 21b, 21c are then planarized to form stacks 21-1 within the openings 221.

Figure 2E:
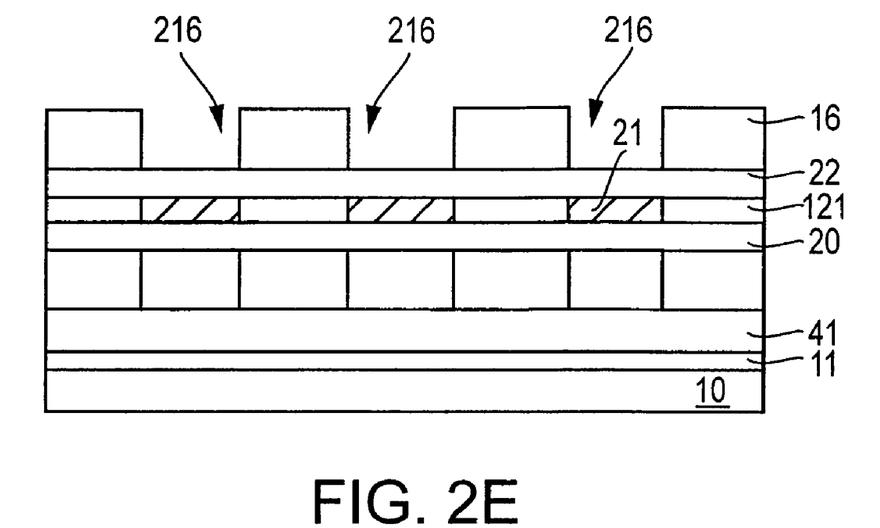

A second amorphous carbon layer 22 is formed over the planarized silver lines 21 and insulating layer 121 by any suitable technique, as illustrated in FIG. 2E. Like the first amorphous carbon layer 20, the second amorphous carbon layer 22 is formed having a greater amount of sp3 hybridized carbon than sp2 hybridized carbon. Preferably, the first and second amorphous carbon layers 20, 22 have the same ratio of sp3 hybridized carbon to sp2 hybridized carbon. The second amorphous carbon layer 22 is formed to a thickness within the range of approximately 50 Å to approximately 500 Å, and preferably between approximately 100 Å to approximately 300 Å.

An insulating layer 16 is formed over the second amorphous carbon layer 22. The insulating layer 16 can be silicon nitride, a low dielectric constant material, or other suitable insulators known in the art, and may be formed by any method known in the art. Preferably, the insulating layer 16 (e.g., silicon nitride) does not allow silver ion migration. Openings 216 are made in the insulating layer 16 by, for instance, photolithographic and etching techniques.

Figure 2F:
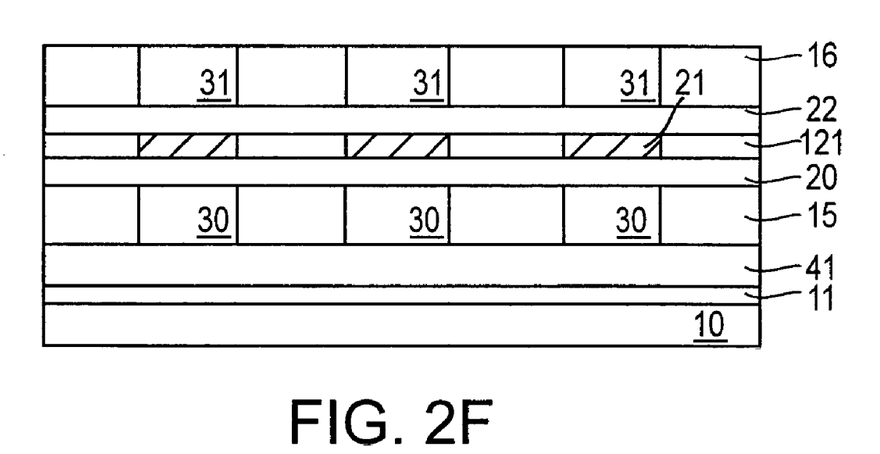

As depicted in FIG. 2F, a layer of conductive material is deposited over the insulating layer 16 and in the openings 216. The conductive material is planarized, for example, by a CMP step, to form conductive plugs 31 within the openings 216. Any suitable conductive material, such as doped polysilicon, tungsten, nickel, aluminum, platinum, titanium, among other materials, can be used to form the second conductive plugs 31.

The second conductive address line 43 (FIG. 1A) is formed over the conductive plugs 31 and insulating layer 16 by depositing a conductive material, such as doped polysilicon, aluminum, platinum, silver, gold, nickel, titanium, or tungsten. The conductive material maybe deposited by any technique known in the art, such as sputtering, chemical vapor deposition, plasma enhanced chemical vapor deposition, evaporation, or plating. The conductive material is then patterned to define the second address line 43, such that the second address line 43 is parallel to the first address line 41 and perpendicular to the silver lines 21, to achieve the structure shown in FIG. 1A (or FIG. 1B). Alternatively, a damascene process can be used in which the conductive material is deposited in trenches in an insulating layer and then CMP processed to the surface of the insulating layer.

Additional processing steps can be conducted to complete the device 100. For example, interconnection lines, contacts, and circuitry are formed to connect the first and second address lines 41, 43 and the silver lines 21 (or conductive line 21b (FIG. 1B)) to operational circuitry 40.

Figure 3A:
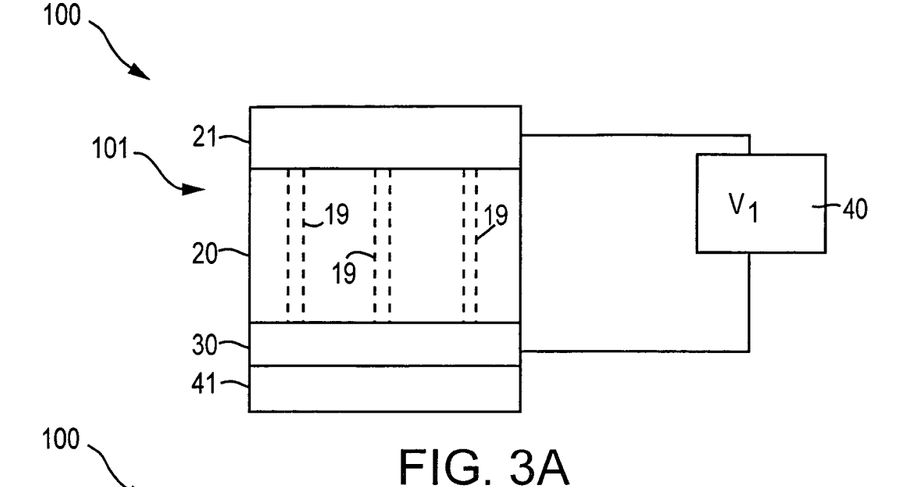
FIGS. 3A-3C illustrate the operation of the memory device of FIG. 1A according to an exemplary embodiment of the invention.
Figure 3B:
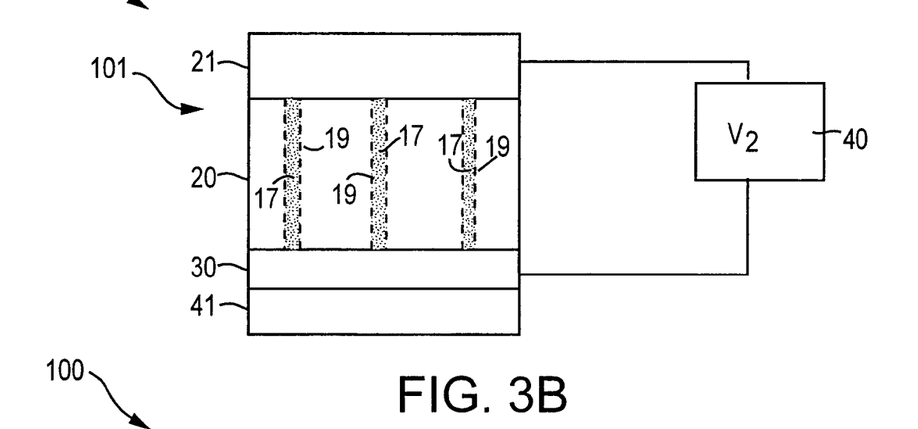
Figure 3C:
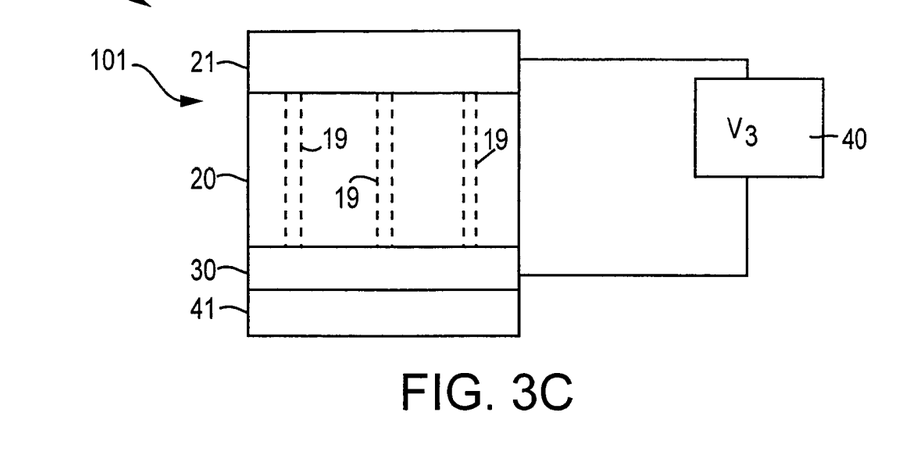

FIGS. 3A-3C depict the operation of the memory device 100 (FIGS. 1A and 1B) according to an exemplary embodiment of the invention. The operation of the device 100 is described with reference to a single memory element 101 of FIG. 1A. It should be readily understood that the operation of the device 100 with respect to other memory elements 101, 102 is analogous to that described with respect to the memory element 101 in connection with FIGS. 3A-3C.

In the exemplary embodiment illustrated in FIG. 1A, once the memory device 100 is formed and prior to a conditioning step, the memory elements 101 is in a high state of resistance. As shown in FIG. 3A, a conditioning operation is performed by applying a voltage pulse $V_1$ of a given duration and magnitude using, for example, the voltage source of operational circuitry 40. It is believed that application of the conditioning voltage causes silver ions from the silver lines 21 to be incorporated into the first amorphous carbon layer 20 to form one or more conducting channels 19 in the first amorphous carbon layer 20. Each conducting channel 19 can support a conductive pathway 17 (FIG. 3B) during operation of the memory element 101. After application of the conditioning pulse, memory element 101 is in a medium state of resistance.

In the medium resistance state, the memory element 101 is still considered OFF (e.g., a first logic state). Once in a medium resistance state, the element 101 remains OFF until a conducting channel 19 receives excess silver ions from the silver lines 21 forming a conductive pathway 17 during a write operation.

Referring to FIG. 3B, during a write operation, excess silver ions from the silver lines 21 are believed to enter one or more of the conducting channels 19 within the first amorphous carbon layer 20 forming a low resistance conductive pathway 17. A write mode exists when a voltage $V_2$ less than the conditioning voltage $V_1$ is applied across memory element 101, thereby generating an ON state (low resistance state, e.g., a second logic state) for memory element 101.

The device 100 of FIG. 1B including the stack of layers 21-1, instead of silver lines, can be operated in a similar manner. In the case of the device 100 of FIG. 1B, it is believed that metal ions from the metal containing layer 21a, e.g., silver ions from a silver-selenide layer 21a, enter one or more of the conducting channels 19 within the first amorphous carbon layer 20 forming a low resistance conductive pathway 17.

During a write operation the silver ions migrate toward the negative potential, here, the first address line 41, when applied across the memory element 101. The silver ions take the path of least resistance into the first amorphous carbon layer 20, which is provided by the conducting channels 19. The movement of the silver ions into a conducting channel 19 forms a low resistance conductive pathway 17.

A read operation is conducted by applying a read potential $V_3$, which is less than write potential $V_2$, to the memory element 101. In the exemplary embodiment depicted in FIG. 3C, the read potential $V_3$ is applied to the memory element 101, which is in an OFF state (FIG. 3A). Current flow through the memory element 101 can be sensed by a current sensing amplifier, which can be part of the operational circuitry 40 and provides an output representing the resistance state of the memory element 101. The read voltage $V_3$ does not disturb other memory elements 101, 102 (FIG. 1A) in the device 100, which are in the medium resistance OFF state (FIG. 3A), since the read voltage $V_3$ is lower than the write voltage $V_2$.

Figure 4:
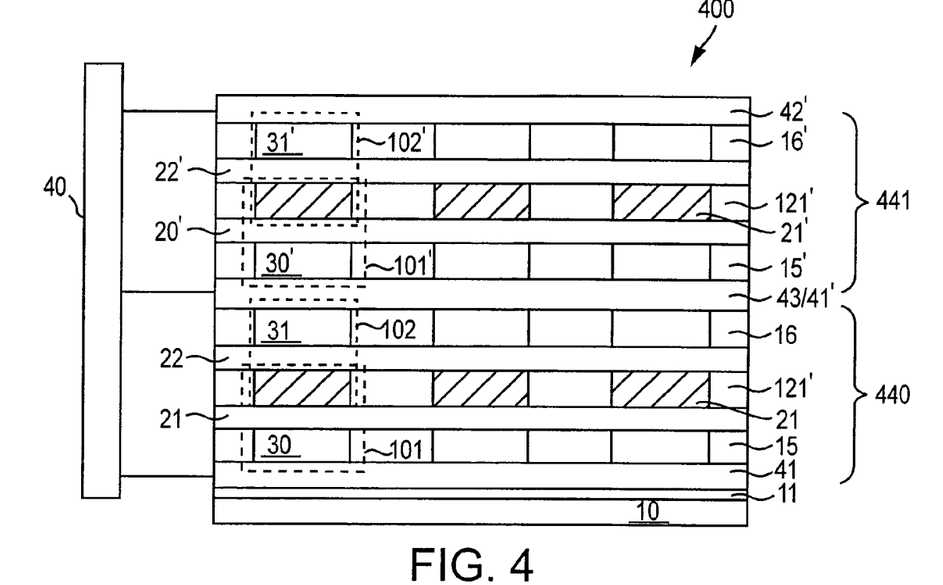
FIG. 4 illustrates cross sectional view of a memory device according to another exemplary embodiment of the invention.

FIG. 4 depicts a memory device 400 according to another exemplary embodiment of the invention. The memory device 400 is similar to the memory device 100 (FIGS. 1A and 1B), and includes an additional memory device stack 440 that includes memory elements 101', 102'. For purposes of this specification a "'" following a reference numeral indicates an additional structure of a like structure within a same device. Accordingly, for the device 400, the memory elements 101, 102 have a same structure as the additional memory elements 101', 102'. As shown in FIG. 4, the second address line 43 also serves as a first address line 41' of the additional stack 440, such that there is a common address line denoted as 43/41'.

While the memory device 400 is shown including silver lines 21, 21', the device 400 could instead include stacks 21-1, 21-1' like the memory device 100 (FIG. 1B). Although the memory device 400 is shown including only one additional memory device stack 440, the device 400 could include a plurality of additional memory device stacks 440. The memory device 400 can be formed as described above in connection with FIGS. 2A-2F, but with repeated processing steps to form the memory device stack 440. Further, the memory device 400 can be operated as described in connection with FIGS. 3A-3C.

Figure 5:
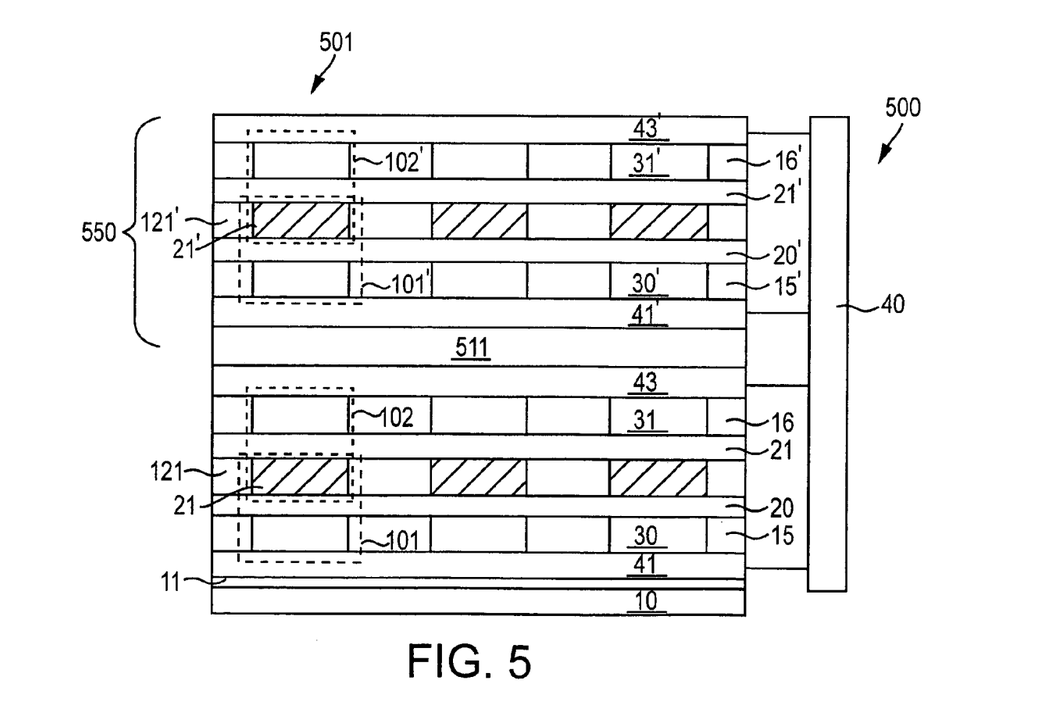
FIG. 5 illustrates a cross sectional view of a memory device according to another exemplary embodiment of the invention.

FIG. 5 shows a memory element 500 according to another embodiment of the invention. The memory device 500 is similar to the memory device 400 (FIG. 4), except that the additional memory device stack 550 includes a separate first address line 41' instead of a common address line 43/41' (FIG. 4). An insulating layer 511 is formed between the second address line 43 and the first address line 41' of the additional stack 550. Although the memory device 500 is shown including only one additional memory device stack 550, the device 500 could include a plurality of additional memory device stacks 550. The memory device 500 can be formed as described above in connection with FIGS. 2A-2F, but with repeated processing steps to form the memory device stack 550. Further, the memory device 500 can be operated as described in connection with FIGS. 3A-3C.

Figure 6A:
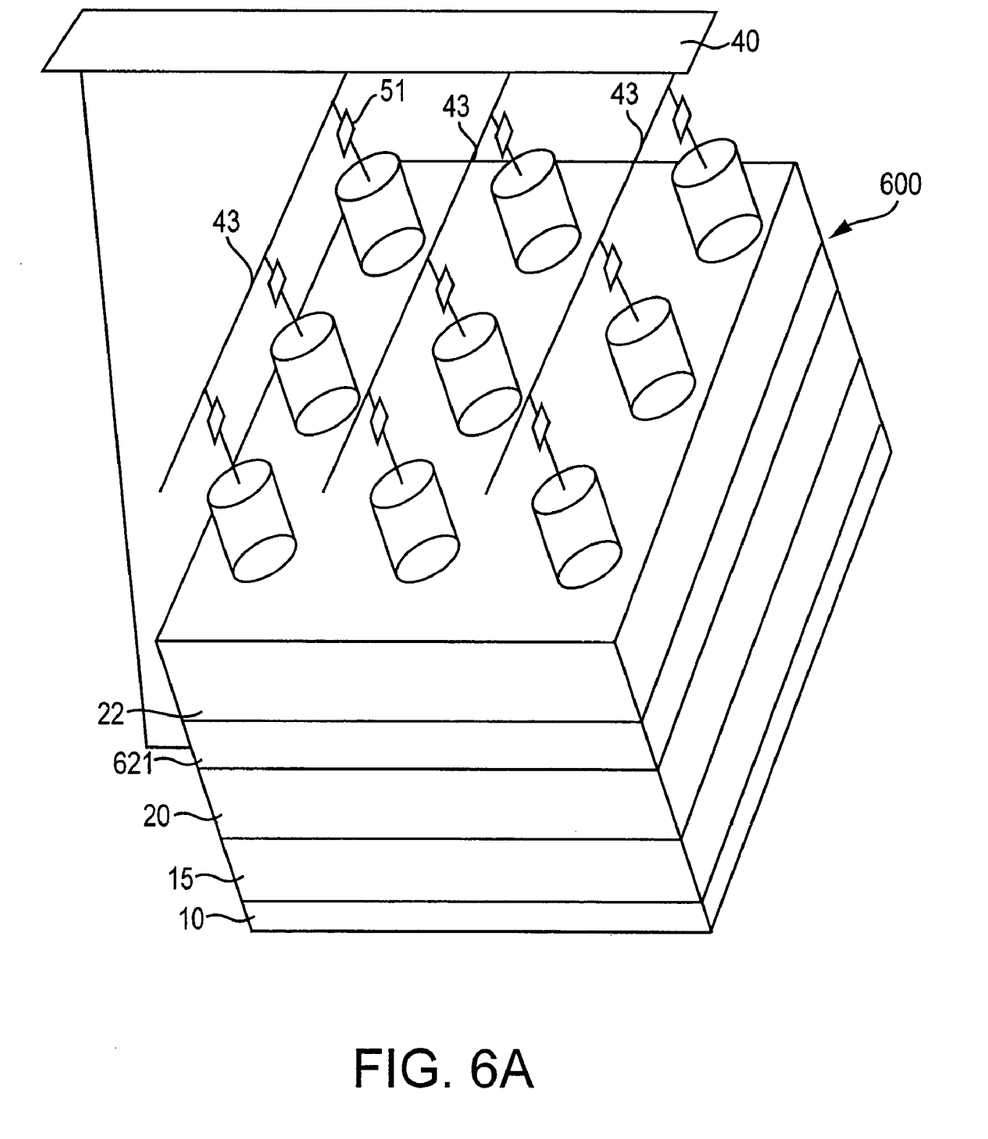
FIG. 6A illustrates a three dimensional cross sectional view of a memory device according to another exemplary embodiment of the invention.
Figure 6B:
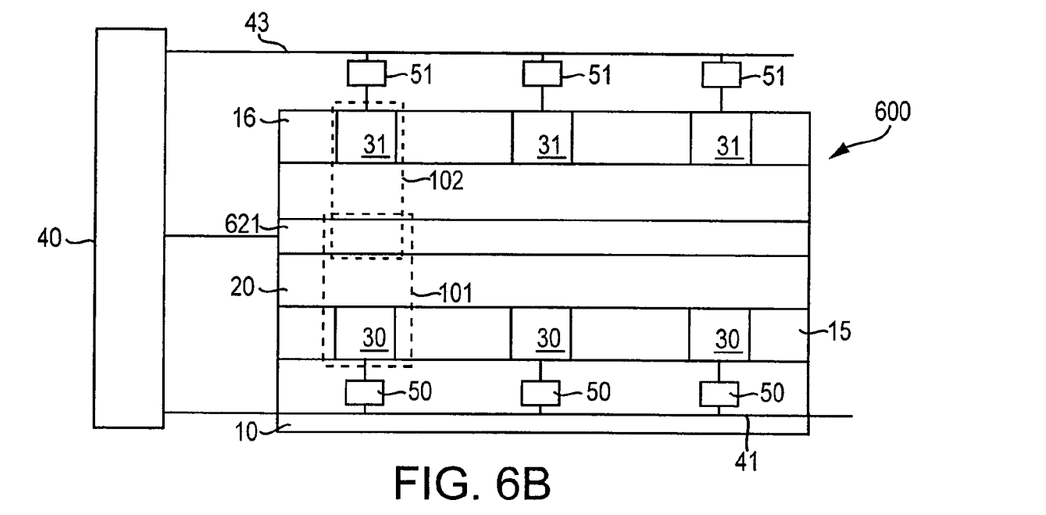
FIG. 6B illustrates a cross sectional view of the memory device of FIG. 6A.

FIGS. 6A and 6B illustrate a memory device 600 according to another exemplary embodiment of the invention. The memory device 600 is similar to the memory device 100 of FIGS. 1A and 1B, except that instead of having silver lines 21 between the first and second amorphous carbon layers 20, 22, the memory device 600 includes a blanket silver layer 621 between first and second amorphous carbon layers 20, 22. Since the silver layer 621 is a blanket layer, the first and second address lines 41, 43 need not be formed parallel to one another. Alternatively, as in the case of the memory device 100, the silver layer 621 can instead be a stack of layers 21-1 (FIG. 1B) including a conductive layer 21b between first and second metal containing layers 21a, 21c.

Additionally, the address lines 41, 43 are switchably connected to a plurality of conductive plugs 30, 31, respectively, by a plurality of respective first and second switching circuits 50, 51. The switching circuits are schematically illustrated in FIGS. 6A and 6B, and can be integrated on a semiconductor substrate 10. In the exemplary embodiment depicted in FIG. 6B, each first and second switching circuit 50, 51 is a transistor, but any suitable circuit can be used. Specifically, as shown in FIG. 6B, each first conductive plug 30 is switchably connected to the first address line 41 by a respective first switching circuit 50. Each second conductive plug 31 is switchably connected to the second address line 43 by a respective second switching circuit 51. During operation of the memory device 600, the switching circuitry serves to connect the address lines 41, 43 to memory elements 101, 102 and to isolate memory elements 101, 102 from the first and second address lines 41, 43. Thereby, a particular memory element 101, 102 can be individually operated.

In the embodiment of FIGS. 6A and 6B, the locations at which the first conductive address line 41 is switchably coupled to the first amorphous carbon layer 20 through the first conductive plugs 30 define the memory elements 101. Correspondingly, the location at which a second conductive address line 43 is switchably coupled to the second amorphous carbon layer through the second conductive plugs 31 define the memory elements 102.

The memory device 600 can be formed as described above in connection with FIGS. 2A-2F; except that the step of forming and patterning the insulating layer 121 can be omitted. Additionally, instead of forming the first and second conductive plugs 30, 31 in direct contact with the first and second address lines 41, 43, respectively, first and second switching circuits 50, 51 are formed such that the first and second address lines 41, 43 are switchably coupled to the first and second conductive plugs 30, 31. The switching circuits 50, 51 can be formed by known techniques and the switching circuits 50, 51 can be coupled to respective conductive plugs 30, 31 and address lines 41, 43 by interconnection lines and contacts, as is known in the art. The device 600 can be operated as described in connection with FIGS. 3A-3C.

Figure 7:
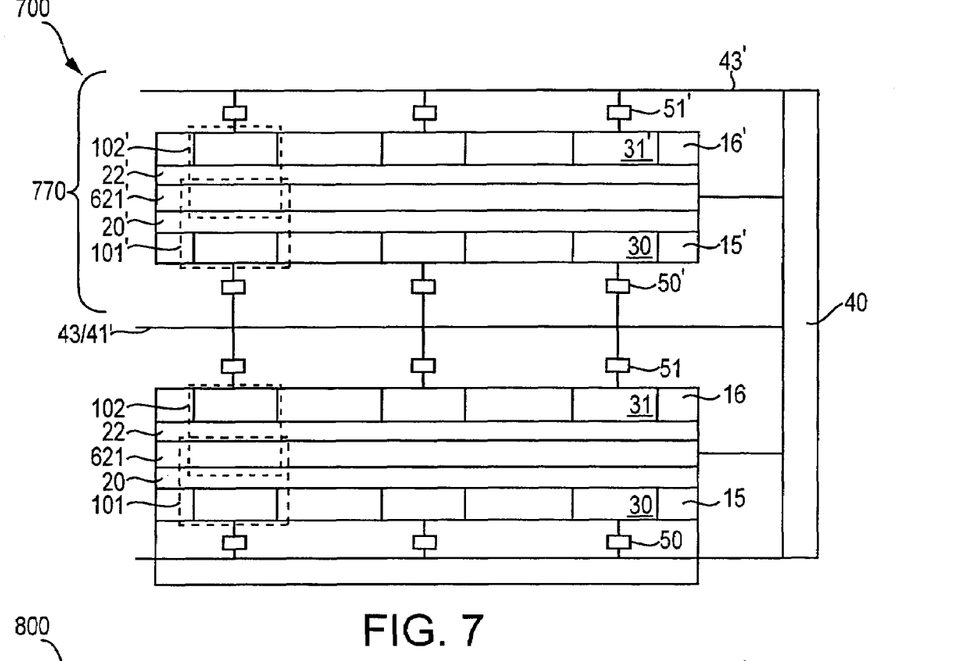
FIG. 7 illustrates a cross sectional view of a memory device according to another exemplary embodiment of the invention.

FIG. 7 illustrates a memory element 700 according to another embodiment of the invention. In the illustrated embodiment, the second address line 43 also serves as a first address line 41' of the additional stack 770, such that there is a common address line 43/41'. Although the memory device 700 is shown including only one additional memory device stack 770, the device 700 could include a plurality of additional memory device stacks 770. While the memory device 700 is shown including silver layers 621, 621', like the memory device 600 (FIGS. 6A and 6B), the device 700 could instead include layer stacks 21-1 (FIG. 1B).

The memory device 700 can be formed as described above in connection with FIG. 6, but with repeated processing steps to form the memory device stack 770. Further, the memory device 700 can be operated as described in connection with FIGS. 3A-3C.

Figure 8:
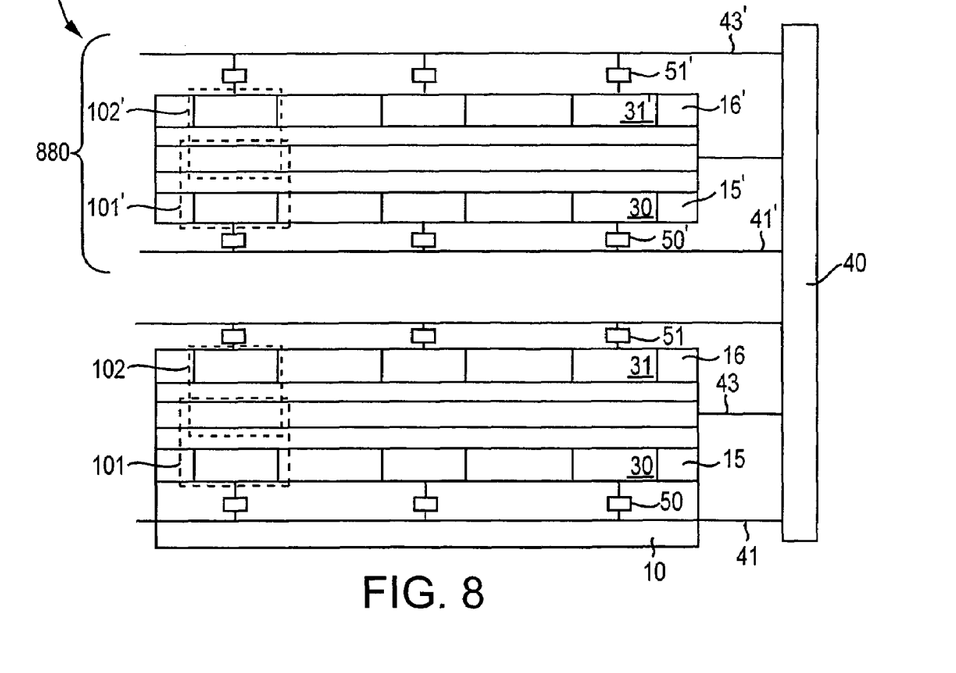
FIG. 8 illustrates a cross sectional view of a memory device according to another exemplary embodiment of the invention.

FIG. 8 shows a memory element 800 according to another exemplary embodiment of the invention. The memory device 800 is similar to the memory device 700 (FIG. 7), except that the additional memory device stack 880 includes a separate first address line 41' instead of a shared address line 43/41' (FIG. 7). Although the memory device 800 is shown including only one additional memory device stack 880, the device 800 could include a plurality of additional memory device stacks 880. The memory device 800 can be formed as described above in connection with FIG. 6, but with repeated processing steps to form the memory device stack 880. Further, the memory device 800 can be operated as described in connection with FIGS. 3A-3C.

Figure 9:
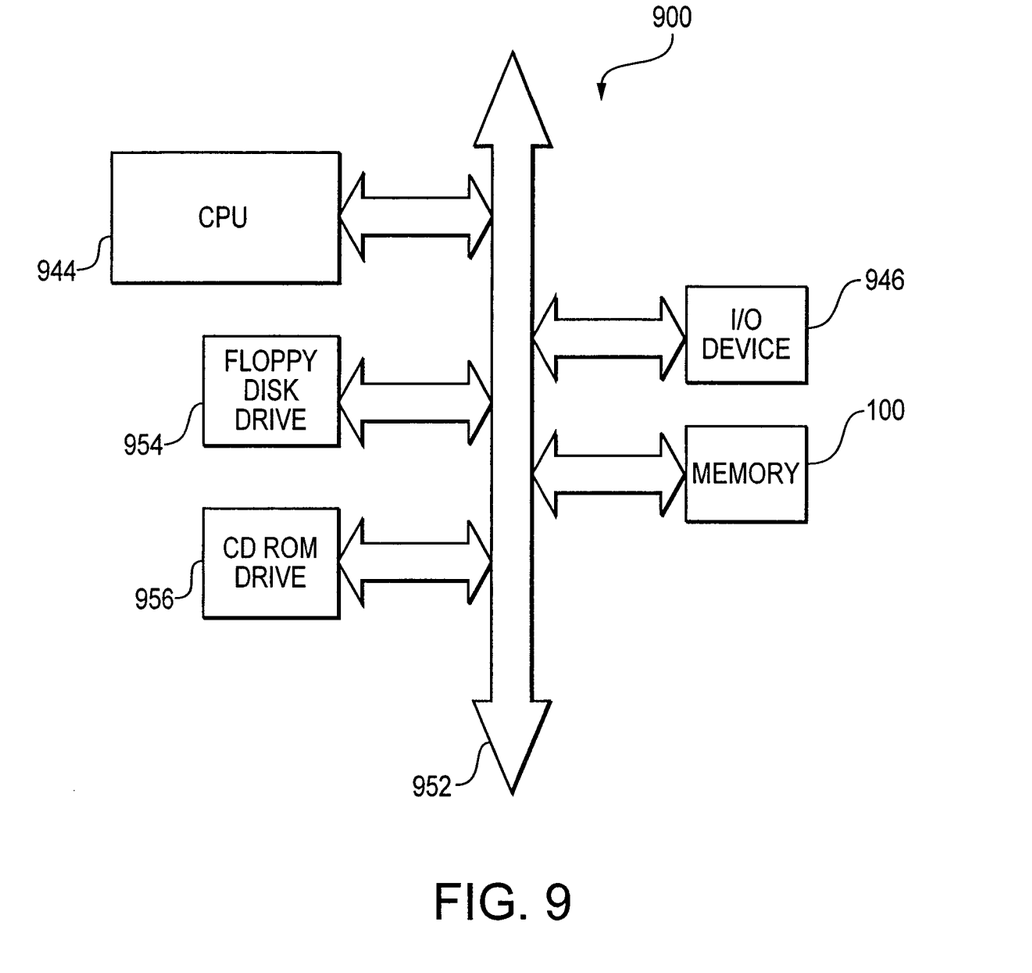
FIG. 9 illustrates a processor system according to an exemplary embodiment of the invention.

FIG. 9 illustrates a processor system 900 which includes a memory device 100 (FIG. 1) according to the invention. Although the processor system 900 is shown including the memory device 100, the processor system 900 could instead include a memory device according to a different embodiment of the invention, for example, any one of memory devices 400, 500, 600, 700, or 800 could be used in the processor system 900. The processor system 900, which can be, for example, a commuter system, generally comprises a central processing unit (CPU) 944, such as a microprocessor, a digital signal processor, or other programmable digital logic devices, which communicates with an input/output (I/O) device 946 over a bus 952. The memory device 100 communicates with the CPU 944 over bus 952 typically through a memory controller.

In the case of a computer system, the processor system 900 may include peripheral devices such as a floppy disk drive 954 and a compact disc (CD) ROM drive 956, which also communicate with CPU 944 over the bus 952. The memory device 100 may be combined with the processor, for example CPU 944, in a single integrated circuit, if desired.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A processor system, comprising:
   a processor; and
   a memory device comprising:
      at least one first memory element comprising a first amorphous carbon element;
      at least one second memory element comprising a second amorphous carbon element, the at least one second memory element being located over the at least one first memory element; and
      at least one first stack of materials located between the at least one first and the at least one second memory elements, the first stack of materials comprising a first conductive material element between first and second metal containing material elements.

2. The system of claim 1, wherein the first and second amorphous carbon elements have greater amount of $sp^3$ hybridized carbon than $sp^2$ hybridized carbon.

3. The system of claim 1, wherein the at least one first stack comprises a plurality of stacked lines.

4. The system of claim 1, further comprising:
   a first conductive line; and
   a second conductive line, wherein the first conductive line is coupled to the first amorphous carbon element at one or more locations to define the at least one first memory element, and the second conductive line is coupled to the second amorphous carbon element at one or more locations to define the at least one second memory element.

5. The system of claim 4, wherein the first and second conductive lines are parallel with respect to each other.

6. The system of claim 4, wherein the first conductive line is coupled to the first amorphous carbon element at a plurality of locations defining a plurality of first memory elements and the second conductive line is coupled to the second amorphous carbon element at a plurality of locations defining a plurality of second memory elements.

7. The system of claim 4, wherein the at least one first stack comprises a silver blanket layer.

8. The system of claim 7, wherein the first conductive line is switchably coupled to the first amorphous carbon element and the second conductive line is switchably coupled to the second amorphous carbon element.

9. The system of claim 8, wherein the first conductive line is switchably coupled to the first amorphous carbon element through at least one first conductive plug and the second conductive line is switchably coupled to the second amorphous carbon element through at least one second conductive plug.

10. The system of claim 4, wherein the at least one first stack comprises a plurality of stacked lines and wherein the first conductive material comprises silver.

11. The system of claim 10, wherein the plurality of stacked lines are perpendicular to the first and second conductive lines.

12. The system of claim 10, further comprising a plurality of first conductive plugs connecting the first conductive line to the first amorphous carbon element and a plurality of second conductive plugs connecting the second conductive line to the second amorphous carbon element.

13. The system of claim 4, further comprising:
third memory element comprising the first amorphous carbon element;
a fourth memory element comprising the second amorphous carbon element, the fourth memory element being located laterally adjacent to the second memory element and over the third memory element; and
at least one second stack of materials located between the at least one first and the at least one second memory elements, the second stack of materials comprising a second conductive material element between third and fourth metal containing material elements.

14. The system of claim 13, wherein the second conductive line is coupled to the third amorphous carbon element at one or more locations to define at least a third memory element and the third conductive line is coupled to the fourth amorphous carbon element at one or more locations to define at least a fourth memory element.

15. The system of claim 13, further comprising a fourth conductive line, wherein the third conductive line is coupled to the third amorphous carbon element at one or more locations to define at least a third memory element and the fourth conductive line is coupled to the fourth amorphous carbon element at one or more locations to define at least a fourth memory element.

16. The system of claim 1, wherein the first and second metal containing material elements comprise one of silver, tin-selenide, antimony-selenide, and silver-selenide.

17. A processor system, comprising:
a processor; and
a memory device comprising:
a first memory element comprising a first amorphous carbon element;
a second memory element comprising a second amorphous carbon element, the second memory element being located over the first memory element;
a third memory element comprising the first amorphous carbon element;
a fourth memory element comprising the second amorphous carbon element, the fourth memory element being located laterally adjacent to the second memory element and over the third memory element;
a first conductive material between the first, second, third and fourth memory elements.

18. The system of claim 17, wherein at least one first conductive material is between the first and second amorphous carbon elements.

19. The system of claim 17, wherein the first and second amorphous carbon elements have greater amount of $sp^3$ hybridized carbon than $sp^2$ hybridized carbon.

20. The system of claim 17, wherein the at least one first conductive layer comprises a plurality of conductive lines.

21. The system of claim 17, further comprising:
a first conductive line; and
a second conductive line, wherein the at least one first conductive material is between the first and second amorphous carbon elements, the first conductive line is coupled to the first amorphous carbon element at one or more locations to define the first and third memory elements, and the second conductive line is coupled to the second amorphous carbon element at one or more locations to define the second and fourth memory elements.

22. The system of claim 21, wherein the first and second conductive lines are parallel with respect to each other.

23. The system of claim 21, wherein the first conductive material is a silver blanket layer.

24. The system of claim 23, wherein the first conductive line is switchably coupled to the first amorphous carbon element and the second conductive line is switchably coupled to the second amorphous carbon element.

25. The system of claim 24, wherein the first conductive line is switchably coupled to the first amorphous carbon element through at least one first conductive plug and the second conductive line is switchably coupled to the second amorphous carbon element through at least one second conductive plug.

26. The system of claim 21, wherein the first conductive material is a silver line.

27. The system of claim 26, wherein the silver lines is perpendicular to the first and second conductive lines.

28. The system of claim 26, further comprising a plurality of first conductive plugs connecting the first conductive line to the first amorphous carbon element and a plurality of second conductive plugs connecting the second conductive line to the second amorphous carbon element.

29. The system of claim 17, further comprising at least one first metal containing material between the first and second amorphous carbon elements.

30. The system of claim 29, wherein the at least one first conductive material is located between first and second metal containing material elements.

31. The system of claim 29, wherein the first and second metal containing material elements comprise one of silver, tin-selenide, antimony-selenide, and silver-selenide.

* * * * *

UNITED STATES PATENT AND TRADEMARK OFFICE
CERTIFICATE OF CORRECTION

PATENT NO.       : 7,619,247 B2                                                    Page 1 of 1
APPLICATION NO.  : 11/447921
DATED            : November 17, 2009
INVENTOR(S)      : Moore et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 594 days.

Signed and Sealed this

Fourteenth Day of December, 2010

David J. Kappos
*Director of the United States Patent and Trademark Office*